United States Patent
Petre et al.

(10) Patent No.: US 11,182,667 B2
(45) Date of Patent: Nov. 23, 2021

(54) MINIMIZING MEMORY READS AND INCREASING PERFORMANCE BY LEVERAGING ALIGNED BLOB DATA IN A PROCESSING UNIT OF A NEURAL NETWORK ENVIRONMENT

(71) Applicant: Microsoft Technology Licensing, LLC, Redmond, WA (US)

(72) Inventors: George Petre, Redmond, WA (US); Chad Balling McBride, North Bend, WA (US); Amol Ashok Ambardekar, Redmond, WA (US); Kent D. Cedola, Bellevue, WA (US); Larry Marvin Wall, Seattle, WA (US); Boris Bobrov, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1044 days.

(21) Appl. No.: 15/813,952

(22) Filed: Nov. 15, 2017

(65) Prior Publication Data
US 2018/0300607 A1    Oct. 18, 2018

Related U.S. Application Data

(60) Provisional application No. 62/486,432, filed on Apr. 17, 2017.

(51) Int. Cl.
*G06N 3/06* (2006.01)
*G06N 3/10* (2006.01)
(Continued)

(52) U.S. Cl.
CPC ............. *G06N 3/063* (2013.01); *G06F 1/324* (2013.01); *G06F 1/3275* (2013.01);
(Continued)

(58) Field of Classification Search
None
See application file for complete search history.

(56) References Cited

U.S. PATENT DOCUMENTS

| 4,298,954 A | 11/1981 | Bigelow et al. |
| 5,091,864 A | 2/1992 | Baji et al. |
| (Continued) | | |

FOREIGN PATENT DOCUMENTS

| CN | 1790918 A | 6/2006 |
| CN | 101183873 A | 5/2008 |
| (Continued) | | |

OTHER PUBLICATIONS

Jakubiuk, W. (Feb. 2, 2016). High performance data processing pipeline for connectome segmentation. DSpace@MIT Home. https://dspace.mit.edu/handle/1721.1/106122 (Year: 2016).*

(Continued)

*Primary Examiner* — Vincent Gonzales
(74) *Attorney, Agent, or Firm* — Newport IP, LLC; Han K. Gim

(57) ABSTRACT

The performance of a neural network (NN) and/or deep neural network (DNN) can be limited by the number of operations being performed as well as management of data among the various memory components of the NN/DNN. By inserting a selected padding in the input data to align the input data in memory, data read/writes can be optimized for processing by the NN/DNN thereby enhancing the overall performance of a NN/DNN. Operatively, an operations controller/iterator can generate one or more instructions that inserts the selected padding into the data. The data padding can be calculated using various characteristics of the input data as well as the NN/DNN as well as characteristics of the cooperating memory components. Padding on the output data can be utilized to support the data alignment at the (Continued)

memory components and the cooperating processing units of the NN/DNN.

22 Claims, 9 Drawing Sheets

(51) Int. Cl.

| | | |
|---|---|---|
| *G06N 3/04* | (2006.01) | |
| *G06F 9/38* | (2018.01) | |
| *G06N 3/063* | (2006.01) | |
| *G06F 12/0862* | (2016.01) | |
| *G06F 9/46* | (2006.01) | |
| *G06F 1/324* | (2019.01) | |
| *G06F 3/06* | (2006.01) | |
| *G06F 12/08* | (2016.01) | |
| *G06F 12/10* | (2016.01) | |
| *G06F 15/80* | (2006.01) | |
| *G06F 17/15* | (2006.01) | |
| *G06N 3/08* | (2006.01) | |
| *H03M 7/30* | (2006.01) | |
| *H04L 12/715* | (2013.01) | |
| *H04L 29/08* | (2006.01) | |
| *G06F 9/30* | (2018.01) | |
| *G06F 13/16* | (2006.01) | |
| *G06F 1/3234* | (2019.01) | |
| *G06F 12/02* | (2006.01) | |
| *G06F 13/28* | (2006.01) | |
| *H03M 7/46* | (2006.01) | |
| *H04L 12/723* | (2013.01) | |

(52) U.S. Cl.
CPC ............ *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(56) References Cited

U.S. PATENT DOCUMENTS

| | | |
|---|---|---|
| 5,487,153 A | 1/1996 | Hammerstrom et al. |
| 5,524,175 A | 6/1996 | Sato et al. |
| 5,644,749 A | 7/1997 | Obayashi |
| 5,859,990 A | 1/1999 | Yarch |
| 5,933,654 A | 8/1999 | Galdun et al. |
| 6,307,867 B1 | 10/2001 | Roobol et al. |
| 6,654,730 B1 | 11/2003 | Kato et al. |
| 6,785,239 B1 | 8/2004 | Tasker |
| 6,990,079 B2 | 1/2006 | Vrabel |
| 7,012,893 B2 | 3/2006 | Bahadiroglu |
| 7,480,640 B1 | 1/2009 | Elad et al. |
| 7,539,608 B1 | 5/2009 | Dageville et al. |
| 7,694,084 B2 | 4/2010 | Raghavan et al. |
| 8,244,953 B1 | 8/2012 | Kumar |
| 8,442,927 B2 | 5/2013 | Chakradhar et al. |
| 8,892,488 B2 | 11/2014 | Qi et al. |
| 8,966,413 B2 | 2/2015 | Shacham et al. |
| 9,015,096 B2 | 4/2015 | Hunzinger |
| 9,143,393 B1 | 9/2015 | Bird et al. |
| 9,378,044 B1 | 6/2016 | Gaurav et al. |
| 9,851,771 B2 | 12/2017 | Cooper et al. |
| 9,959,498 B1 | 5/2018 | Narayanaswami et al. |
| 9,990,307 B1 | 6/2018 | Patel et al. |
| 10,275,001 B2 | 4/2019 | Kam et al. |
| 2002/0133648 A1 | 9/2002 | Goudie et al. |
| 2003/0065631 A1 | 4/2003 | Mcbride |
| 2003/0120799 A1 | 6/2003 | Lahav et al. |
| 2003/0200315 A1 | 10/2003 | Goldenberg et al. |
| 2004/0187135 A1 | 9/2004 | Pronovost et al. |
| 2005/0204189 A1 | 9/2005 | Akiba |
| 2005/0216616 A1 | 9/2005 | Eldar et al. |
| 2006/0047864 A1 | 3/2006 | Brokenshire et al. |
| 2007/0145151 A1 | 6/2007 | Nakamura et al. |
| 2008/0043742 A1 | 2/2008 | Pong et al. |
| 2008/0052441 A1 | 2/2008 | Freking et al. |
| 2008/0087736 A1* | 4/2008 | Silverbrook ........... G06K 19/06 235/494 |
| 2008/0112438 A1 | 5/2008 | Ting et al. |
| 2008/0313385 A1 | 12/2008 | Vijayakumar et al. |
| 2008/0319933 A1 | 12/2008 | Moussa et al. |
| 2009/0037697 A1 | 2/2009 | Ramani et al. |
| 2009/0313195 A1 | 12/2009 | Mcdaid et al. |
| 2010/0180100 A1 | 7/2010 | Lu et al. |
| 2010/0257174 A1 | 10/2010 | Minuti |
| 2010/0281192 A1 | 11/2010 | Rakib et al. |
| 2011/0246722 A1 | 10/2011 | Taha et al. |
| 2012/0130928 A1 | 5/2012 | Bell et al. |
| 2012/0134449 A1 | 5/2012 | Chen et al. |
| 2014/0046882 A1 | 2/2014 | Wood |
| 2014/0181464 A1 | 6/2014 | Forsyth et al. |
| 2014/0281221 A1 | 9/2014 | Wang et al. |
| 2014/0372670 A1 | 12/2014 | Vasilyuk |
| 2015/0286873 A1* | 10/2015 | Davis ................... G06F 1/1694 382/103 |
| 2015/0363239 A1 | 12/2015 | Hsu et al. |
| 2016/0098388 A1 | 4/2016 | Blevins et al. |
| 2016/0184587 A1 | 6/2016 | Heuvel et al. |
| 2016/0267377 A1 | 9/2016 | Pan et al. |
| 2016/0328644 A1 | 11/2016 | Lin et al. |
| 2016/0335119 A1 | 11/2016 | Merrill et al. |
| 2016/0350653 A1 | 12/2016 | Socher et al. |
| 2017/0011288 A1 | 1/2017 | Brothers et al. |
| 2017/0199902 A1 | 7/2017 | Mishra et al. |
| 2018/0189641 A1 | 7/2018 | Boesch et al. |
| 2018/0260690 A1 | 9/2018 | Young et al. |
| 2018/0299943 A1 | 10/2018 | Mcbride et al. |
| 2018/0300601 A1 | 10/2018 | Cedola et al. |
| 2018/0300602 A1 | 10/2018 | Petre et al. |
| 2018/0300603 A1 | 10/2018 | Ambardekar et al. |
| 2018/0300604 A1 | 10/2018 | Mcbride et al. |
| 2018/0300605 A1 | 10/2018 | Ambardekar et al. |
| 2018/0300606 A1 | 10/2018 | Corkery et al. |
| 2018/0300613 A1 | 10/2018 | Petre et al. |
| 2018/0300614 A1 | 10/2018 | Ambardekar et al. |
| 2018/0300615 A1 | 10/2018 | Ambardekar et al. |
| 2018/0300616 A1 | 10/2018 | Ambardekar et al. |
| 2018/0300617 A1 | 10/2018 | Mcbride et al. |
| 2018/0300633 A1 | 10/2018 | Mcbride et al. |
| 2018/0300634 A1 | 10/2018 | Mcbride et al. |
| 2020/0233820 A1 | 7/2020 | Mcbride et al. |
| 2020/0356500 A1 | 11/2020 | Mcbride et al. |

FOREIGN PATENT DOCUMENTS

| | | |
|---|---|---|
| CN | 102332162 A | 1/2012 |
| CN | 106530200 A | 3/2017 |
| EP | 0147857 A2 | 7/1985 |
| EP | 2945290 A2 | 11/2015 |
| EP | 3035204 A1 | 6/2016 |
| EP | 3035249 A1 | 6/2016 |

(56) References Cited

FOREIGN PATENT DOCUMENTS

| WO | 1993014459 A1 | 7/1993 |
|---|---|---|
| WO | 2016118257 A1 | 7/2016 |
| WO | 2016210030 A1 | 12/2016 |

OTHER PUBLICATIONS

Wei, T., Wang, C., Rui, Y., & Chen, C. (Mar. 8, 2016). Network Morphism. arXiv.org. https://arxiv.org/abs/1603.01670 (Year: 2016).*
Bendersky, E. (Sep. 26, 2015). Memory layout of multi-dimensional arrays. Eli Bendersky's website, https://eli.thegreenplace.net/2015/memory-layout-of-multi-dimensional-arrays (Year: 2015).*
Tschopp, F. (Sep. 11, 2015). Efficient Convolutional neural networks for Pixelwise classification on heterogeneous hardware systems. arXiv.org. https://arxiv.org/abs/1509.03371 (Year: 2015).*
Rhu, M., Gimelshein, N., Clemons, J., Zulfiqar, A., & Keckler, S. (Feb. 25, 2016). Virtualizing deep neural networks for memory-efficient neural network design. arXiv.org. https://arxiv.org/abs/1602.08124v1 (Year: 2016).*
Naik, S. (Sep. 26, 2013). Coding for performance: Data alignment and structures. Intel. https://software.intel.com/content/www/us/en/develop/articles/coding-for-performance-data-alignment-and-structures.html (Year: 2013).*
Prokopec, A., Petrashko, D., & Odersky, M. (Apr. 23, 2015). Efficient lock-free work-stealing Iterators for data-parallel collections—IEEE conference publication. IEEE Xplore. https://ieeexplore.ieee.org/document/7092728 (Year: 2015).*
Rahtu, E., Kannala, J., & Blaschko, M. (Jan. 31, 2014). Learning a Category Independent Object Detection Cascade. Inria. https://hal.inria.fr/hal-00855735/file/rahtu11.pdf (Year: 2014).*
Wei, T., Wang, C., Rui, Y., & Chen, C. (Mar. 8, 2016). Network Morphism. arXiv.org. https://arxiv.org/abs/1603.01670 (Year: 2016) (Year: 2016).*
Jakubiuk, W. (Feb. 2, 2016). High performance data processing pipeline for connectome segmentation. DSpace@MIT Home. https://dspace.mit.edu/handle/1721.1/106122 (Year: 2016).*
Rhu, M., Gimelshein, N., Clemons, J., Zulfiqar, A., & Keckler, S. (Feb. 25, 2016). Virtualizing deep neural networks for memory-efficient neural network design. arXiv.org. https://arxiv.org/abs/1602.08124v1 (Year: 2016) (Year: 2016).*
Tschopp, F. (Sep. 11, 2015). Efficient Convolutional neural networks for Pixelwise classification on heterogeneous hardware systems. arXiv.org. https://arxiv.org/abs/1509.03371 (Year: 2015) (Year: 2015).*
"Non Final Office Action Issued in U.S. Appl. No. 15/702,311", dated May 21, 2019, 12 Pages.
"Ex Parte Quayle Action Issued in U.S. Appl. No. 15/950,644", dated Sep. 23, 2019, 7 Pages.
Chi, et al., "PRIME: A Novel Processing-in-memory Architecture for Neural Network Computation in ReRAM-based Main Memory", In Proceedings of ACM/IEEE 43rd Annual International Symposium on Computer Architecture, Jun. 18, 2016, 13 Pages.
"Final Office Action Issued in U.S. Appl. No. 15/702,311", dated Nov. 5, 2018, 12 Pages.
"International Search Report & Written Opinion Issued in PCT Patent Application No. PCT/US18/027674", dated Jul. 13, 2018, 13 Pages.
"International Search Report & Written Opinion Issued in PCT Patent Application No. PCT/US18/027680", dated Sep. 27, 2018, 13 Pages.
"International Search Report & Written Opinion Issued in PCT Patent Application No. PCT/US18/027828", dated Aug. 3, 2018, 11 Pages.
"International Search Report & Written Opinion Issued in PCT Patent Application No. PCT/US18/027834", dated Jul. 24, 2018, 11 Pages.
"International Search Report & Written Opinion Issued in PCT Patent Application No. PCT/US18/027836", dated Aug. 3, 2018, 14 Pages.
"International Search Report & Written Opinion Issued in PCT Patent Application No. PCT/US18/027837", dated Aug. 3, 2018, 10 Pages.
"International Search Report & Written Opinion Issued in PCT Patent Application No. PCT/US18/027840", dated Jul. 30, 2018, 9 Pages.
"Notice of Allowance Issued in U.S. Appl. No. 15/694,663", dated May 8, 2020, 9 Pages.
"Notice of Allowance Issued in U.S. Appl. No. 15/702,311", dated Sep. 11, 2019, 6 Pages.
"Non Final Office Action Issued In U.S. Appl. No. 15/702,311", dated Jun. 29, 2018, 10 Pages.
"International Search Report and Written Opinion Issued In PCT Application No. PCT/US2018/026358", dated Jul. 11, 2018, 15 Pages.
"International Search Report and Written Opinion Issued In PCT Application No. PCT/US2018/026352", dated Jun. 27, 2018, 11 Pages.
"International Search Report and Written Opinion Issued In PCT Application No. PCT/US2018/026353", dated Jul. 6, 2018, 15 Pages.
"International Search Report and Written Opinion Issued In PCT Application No. PCT/US2018/026354", dated Jul. 31, 2018, 15 Pages.
"International Search Report and Written Opinion Issued In PCT Application No. PCT/US2018/026355", dated Jul. 9, 2018, 16 Pages.
"International Search Report and Written Opinion Issued In PCT Application No. PCT/US2018/026356", dated Jul. 6, 2018, 16 Pages.
"International Search Report and Written Opinion Issued In PCT Application No. PCT/US2018/026357", dated Jul. 9, 2018, 16 Pages.
"Final Office Action issued in U.S. Appl. No. 16/942,728", dated Nov. 30, 2020, 10 Pages.
"Non Final Office Action Issued in U.S. Appl. No. 16/942,728", dated Sep. 10, 2020, 10 Pages.
"First Office Action and Search Report Issued in Chinese Patent Application No. 201880025420.1", dated Sep. 24, 2020, 6 Pages.

* cited by examiner

MINIMIZING MEMORY READS AND INCREASING PERFORMANCE BY LEVERAGING ALIGNED BLOB DATA IN A PROCESSING UNIT OF A NEURAL NETWORK ENVIRONMENT

RELATED APPLICATION

This application claims priority under 35 U.S.C. 119(e) to U.S. Provisional Patent Application No. 62/486,432, filed on Apr. 17, 2017 and titled "Enhanced Neural Network Designs," the entire disclosure of which is incorporated in its entirety by reference herein.

BACKGROUND

While performing one or more processing operations such as convolution on an exemplary layer of a neural network (NN) or deep neural network (DNN), reading data from memory accounts for the expenditure of a substantial amount of time and processing resources consumed by the NN/DNN. Generally, a controller component of the NN/DNN is tasked with performing the processing operations required to iterate over large amounts of data in order to apply specific operations. Typically, some existing NN and DNNs expend avoidable processing time (e.g., floating/fixed point operations per second (GFlops/s)) and memory space (e.g., number of bytes transferred per second (GBytes/s)) in performing various operations inclusive of memory reads and writes to various cooperating memory components of the NN/DNN (e.g., line buffer) as well as performing one or more operations on the layer data to optimize processing operations.

Specifically, current practices do not identify critical features of input/data and/or provide instructions to the cooperating components of the NN or DNN regarding how best to manage/direct the read/write operations for the input data in the cooperating NN or DNN memory components, as well as to exploit data characteristics in memory to avoid performance issues. Part in parcel with the performance impact associated with inefficient data processing in NN or DNN is the inefficient processing of data amongst the neural processing components of the NN or DNN. Such inefficient data management and processing requires additional, often avoidable, computations/neural processor operations that negatively impact overall NN/DNN performance.

A more advantageous NN/DNN would deploy a set of instructions that directs the cooperating controller and processing components of the NN/DNN to operatively logically map the input data based on specified data dimensions (e.g., size of the data, continuity of the data as represented in a logical data model, etc.), and to align the logically mapped data in the cooperating memory components that would minimize the number of reads and writes to the cooperating memory components during a data processing cycle. Operatively, the newly aligned data results in a reduced number of memory operations. The alignment of the data in memory can be achieved using various data padding techniques.

It is with respect to these considerations and others that the disclosure made herein is presented.

SUMMARY

Techniques described herein provide for the virtualization of one or more hardware iterators to be utilized in an exemplary neural network (NN) and/or Deep Neural Network (DNN) environment, wherein a physical padding of the data to align the data in the memory components allows for the processing of data that improves overall performance and optimizes memory management. It is appreciated that the herein described systems and methods are applicable to NNs and/or DNNs and as such, when reference is made to a NN it shall also mean a DNN and vice versa.

In an illustrative implementation, an exemplary DNN environment can comprise one or more processing blocks (e.g., computer processing units—(CPUs), a memory controller, a line buffer, a high bandwidth fabric (e.g., local or external fabric)(e.g., a data bus passing data and/or data elements between an exemplary DNN module and the cooperating components of a DNN environment), an operation controller, and a DNN module. In the illustrative implementation, the exemplary DNN module can comprise an exemplary DNN state controller, a descriptor list controller (DLC), dMA (DDMA), DMA Streaming Activations (DSA), an operation controller, a load controller, and a store controller.

In an illustrative operation, the operation controller of the NN/DNN environment can operatively process large amounts of data in order to apply one or more desired data processing operations (e.g., convolution, max pooling, scalar multiply/add, summation, fully connected, etc.). In the illustrative operation, a participating user can specify the dimensions of the data being processed as well as the configuration on how to process through the data for use by the NN/DNN computing environment.

In an illustrative implementation, data to be processed by the NN/DNN environment can be represented as a blob. Generally, a blob represents the data in memory that needs to be iterated. Each blob can maintain a logical mapped shape defined by various dimensions such as width, height, number of channels, number of kernels, and other available dimensional units. In an illustrative operation, the operations controller can traverse a multi-dimensional blob (e.g., as defined by a logical data mapping) or a smaller N dimensional slice of such a blob, where N is the number of dimensions (e.g., for a 3D blob representing an image with width, height and number of channels–N=3) (e.g., using one or more hardware or virtualized iterators). The traversed blob can be communicated to a cooperating line buffer with one or more instructions to manage the read/writes of the traversed data within the line buffer.

Illustratively, the operations controller and/or iterators such as a hardware and/or virtualized hardware iterator can generate one or more instructions to include physical padding of the blob in one or more cooperating memory components that results in the alignment of the blob data blocks in the memory components. The alignment of the blob data can be achieved by inserting a selected size of data bits into the blob such that when the memory blocks that are being read during a processing cycle, the first bit in that memory block will be used in the read operation. In an illustrative implementation, for an exemplary convolution layer, the lines of the input data can be padded with a selected number of bits such that the size of the padded width of the input data can be a multiple of the memory block size.

Padding can also be implemented across other dimensions of the blob inclusive of the blob kernels. Illustratively, for an exemplary convolution operation of a kernel, the kernel channels can be padded with a selected number of bits such that the first value of the channels of the kernel is mapped to the first value in a memory block of a cooperating memory component.

It should be appreciated that, although described in relation to a system performing convolution operations of a DNN layer, the inventive concepts described herein can be applied using other types of DNN data processing/management operations. Further, the above-described subject matter may also be implemented as a computer-controlled apparatus, a computer process, a computing system, or as an article of manufacture such as a computer-readable medium and/or dedicated chipset. These and various other features will be apparent from a reading of the following Detailed Description and a review of the associated drawings. This Summary is provided to introduce a selection of concepts in a simplified form that are further described below in the Detailed Description.

It should be appreciated that the described subject matter may be implemented as a computer-controlled apparatus, a computer process, a computing system, or as an article of manufacture such as a computer-readable storage medium. Among many other benefits, the techniques herein improve efficiencies with respect to a wide range of computing resources. For instance, the output blob having the selected inserted data padding can reduce a number of computing cycles needed to perform a number of complex tasks, such as facial recognition, object recognition, image generation, etc. In addition, improved human interaction can be achieved by the introduction of more accurate and faster completion of such tasks. In addition, the use of the output blob having the selected inserted data padding can reduce network traffic, reduce power consumption and usage of memory. Other technical effects other than those mentioned herein can also be realized from implementations of the technologies disclosed herein.

This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with a letter of a sequence of letters to refer to each individual item. Generic references to the items may use the specific reference number without the sequence of letters.

DETAILED DESCRIPTION

Figure 1:
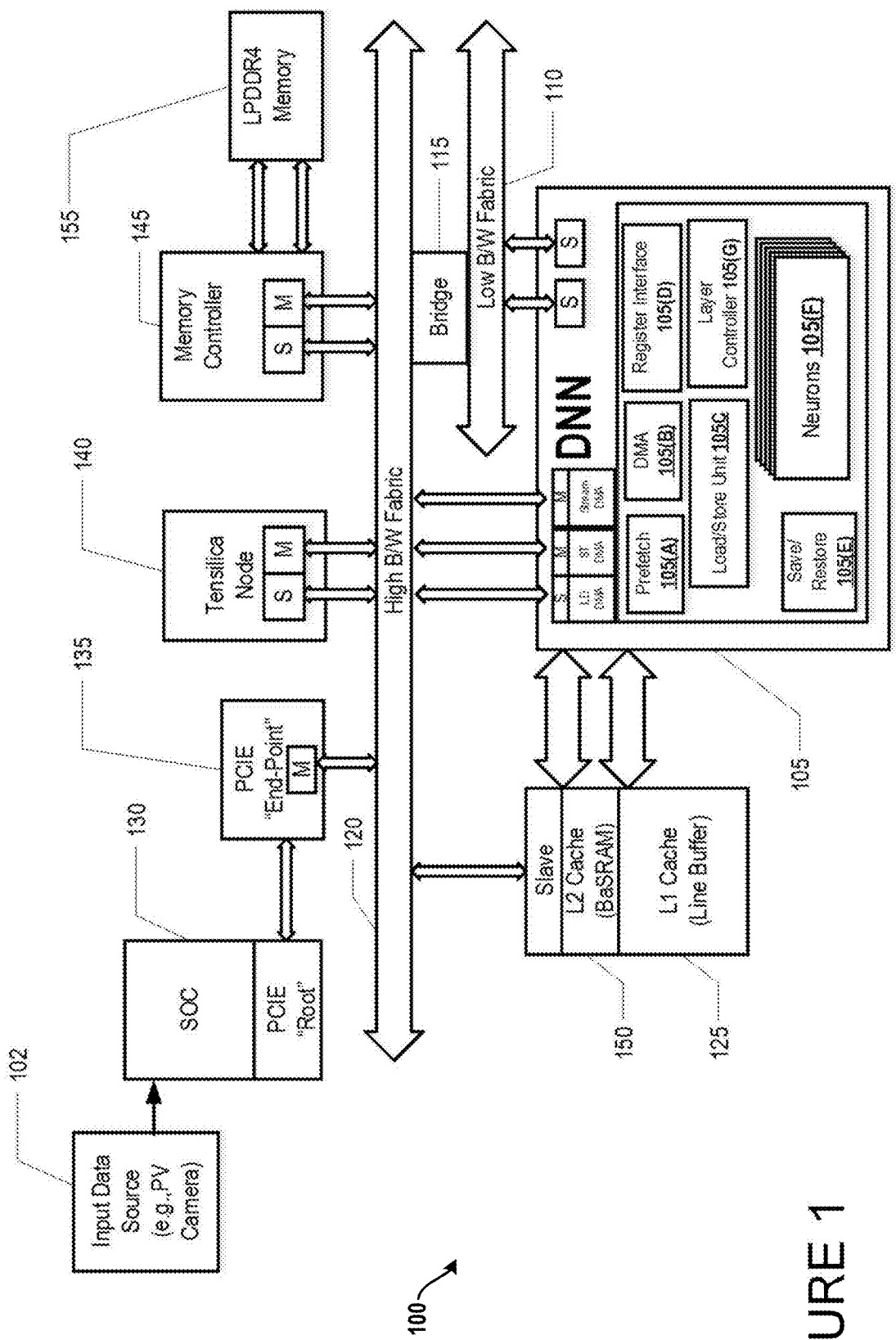
FIG. 1 illustrates a block diagram of an exemplary neural networking computing environment in accordance with the herein described systems and methods.

The following Detailed Description techniques described herein provide for the virtualization of one or more hardware iterators to be utilized in an exemplary neural network (NN) and/or Deep Neural Network (DNN) environment, wherein a physical padding of the data to align the data in the memory components allows for the processing of data that improves overall performance and optimizes memory management. It is appreciated that the herein described systems and methods are applicable to NNs and/or DNNs and as such, when reference is made to a NN it shall also mean a DNN and vice versa.

In an illustrative implementation, an exemplary DNN environment can comprise one or more processing blocks (e.g., computer processing units—(CPUs), a memory controller, a line buffer, a high bandwidth fabric (e.g., local or external fabric)(e.g., data bus passing data and/or data elements between an exemplary DNN module and the cooperating components of a DNN environment), an operation controller, and a DNN module. In the illustrative implementation, the exemplary DNN module can comprise an exemplary DNN state controller, a descriptor list controller (DLC), dMA (DDMA), DMA Streaming Activations (DSA), an operation controller, a load controller, and a store controller.

In an illustrative operation, the operation controller of the NN/DNN environment can operatively process large amounts of data in order to apply one or more desired data processing operations (e.g., convolution, max pooling, scalar multiply/add, summation, fully connected, etc.). In the illustrative operation, a participating user can specify the dimensions of the data being processed as well as the configuration on how to process through the data for use by the NN/DNN computing environment.

In an illustrative implementation, data to be processed by the NN/DNN environment can be represented as a blob. Generally, a blob represents the data in memory that needs to be iterated. Each blob can maintain a logical mapped shape defined by various dimensions such as width, height, number of channels, number of kernels, and other available dimensional units. In an illustrative operation, the operation controller can traverse across a multi-dimensional blob (e.g., as defined by a logical data mapping) or a smaller N dimensional slice of such a blob, where N is the number of dimensions (e.g., for a 3D blob representing an image with width, height and number of channels–N=3) (e.g., using one or more hardware or virtualized iterators). The traversed blob can be communicated to a cooperating line buffer with one or more instructions to manage the read/writes of the traversed data within the line buffer.

Illustratively, the operations controller and/or iterators such as a hardware and/or virtualized hardware iterator can generate one or more instructions to include physical padding of the blob in one or more cooperating memory components that results in the alignment of the blob data blocks in the memory components. The alignment of the blob data can be achieved by inserting a selected size of data bits into the blob such that when the memory blocks are being read during a processing cycle, the first bit in that memory block will be used in the read operation. In an illustrative implementation, for an exemplary convolution layer, the lines of the input data can be padded with a selected number of bits such that the size of the padded width of the input data can be a multiple of the memory block size.

Padding can also be implemented across other dimensions of the blob inclusive of the blob kernels. Illustratively, for an exemplary convolution operation of a kernel, the kernel channels can be padded with a selected number of bits such that the first value of the channels of the kernel is mapped to the first value in a memory block of a cooperating memory component.

Neural Networks Background:

In artificial neural networks, a neuron is the base unit used to model a biological neuron in the brain. The model of an artificial neuron can include the inner product of an input vector with a weight vector added to a bias, with a non-linearity applied. Comparatively, a neuron, in an exemplary DNN module, (e.g., 105 of FIG. 1) is closely mapped to an artificial neuron.

Illustratively, the DNN module can be considered a superscalar processor. Operatively, it can dispatch one or more instructions to multiple execution units called neurons. The execution units can be "simultaneous dispatch simultaneous complete" where each execution unit is synchronized with all of the others. A DNN module can be classified as a SIMD (single instruction stream, multiple data stream) architecture.

Turning to exemplary DNN environment 100 of FIG. 1, DNN module 105 has a memory subsystem with a unique L1 and L2 caching structure. These are not traditional caches, but are designed specifically for neural processing. For convenience, these caching structures have adopted names that reflect their intended purpose. By way of example, the L2 cache 150 can illustratively maintain a selected storage capacity (e.g., one megabyte (1 MB)) with a high speed private interface operating at a selected frequency (e.g., sixteen giga-bits per second (16 GBps)). The L1 cache can maintain a selected storage capacity (e.g., eight kilobytes (8 KB) that can be split between kernel and activation data. The L1 cache can be referred to as Line Buffer, and the L2 cache is referred to as BaSRAM.

The DNN module can be a recall-only neural network and programmatically support a wide variety of network structures. Training for the network can be performed offline in a server farm or data center; the DNN module does not perform any training functions. The result of training is a set of parameters that can be known as either weights or kernels. These parameters represent a transform function that can be applied to an input with the result being a classification or semantically labeled output.

In an illustrative operation, the DNN module can accept planar data as input. Input is not limited to image data only, as long as the data presented is in a uniform planar format the DNN can operate on it.

The DNN module operates on a list of layer descriptors which correspond to the layers of a neural network. Illustratively, the list of layer descriptors can be treated by the DNN module as instructions. These descriptors can be pre-fetched from memory into the DNN module and executed in order.

Generally, there can be two main classes of layer descriptors: 1) Memory-to-memory move descriptors, and 2) Operation descriptors. Memory-to-memory move descriptors can be used to move data to/from the main memory to/from a local cache for consumption by the operation descriptors. Memory-to-memory move descriptors follow a different execution pipeline than the operation descriptors. The target pipeline for memory-to-memory move descriptors can be the internal DMA engine, whereas the target pipeline for the operation descriptors can be the neuron processing elements. Operation descriptors are capable of many different layer operations.

The output of the DNN is also a blob of data. The output can optionally be streamed to a local cache or streamed to main memory. The DNN module can pre-fetch data as far ahead as the software will allow. Software can control pre-fetching by using fencing and setting dependencies between descriptors. Descriptors that have dependencies sets are prevented from making forward progress until the dependencies have been satisfied.

Turning now to FIG. 1, an exemplary neural network environment 100 can comprise various cooperating components inclusive of DNN module 105, cache memory 125 or 150, low bandwidth fabric 110, bridge component 115, high bandwidth fabric 120, SOC 130, PCIE "End Point" 135, Tensilica Node 140, memory controller 145, LPDDR4 memory 155, and an input data source 102. Further, as is shown, DNN module 105 can also comprise a number of components comprising prefetch 105(A), DMA 105(B), Register Interface 105(D), load/store unit 105(C), layer controller 105G, save/restore component 105(E), and neurons 105(F). Operatively, an exemplary DNN environment 100 can process data according to a selected specification wherein the DNN module performs one or more functions as described herein.

Figure 2:
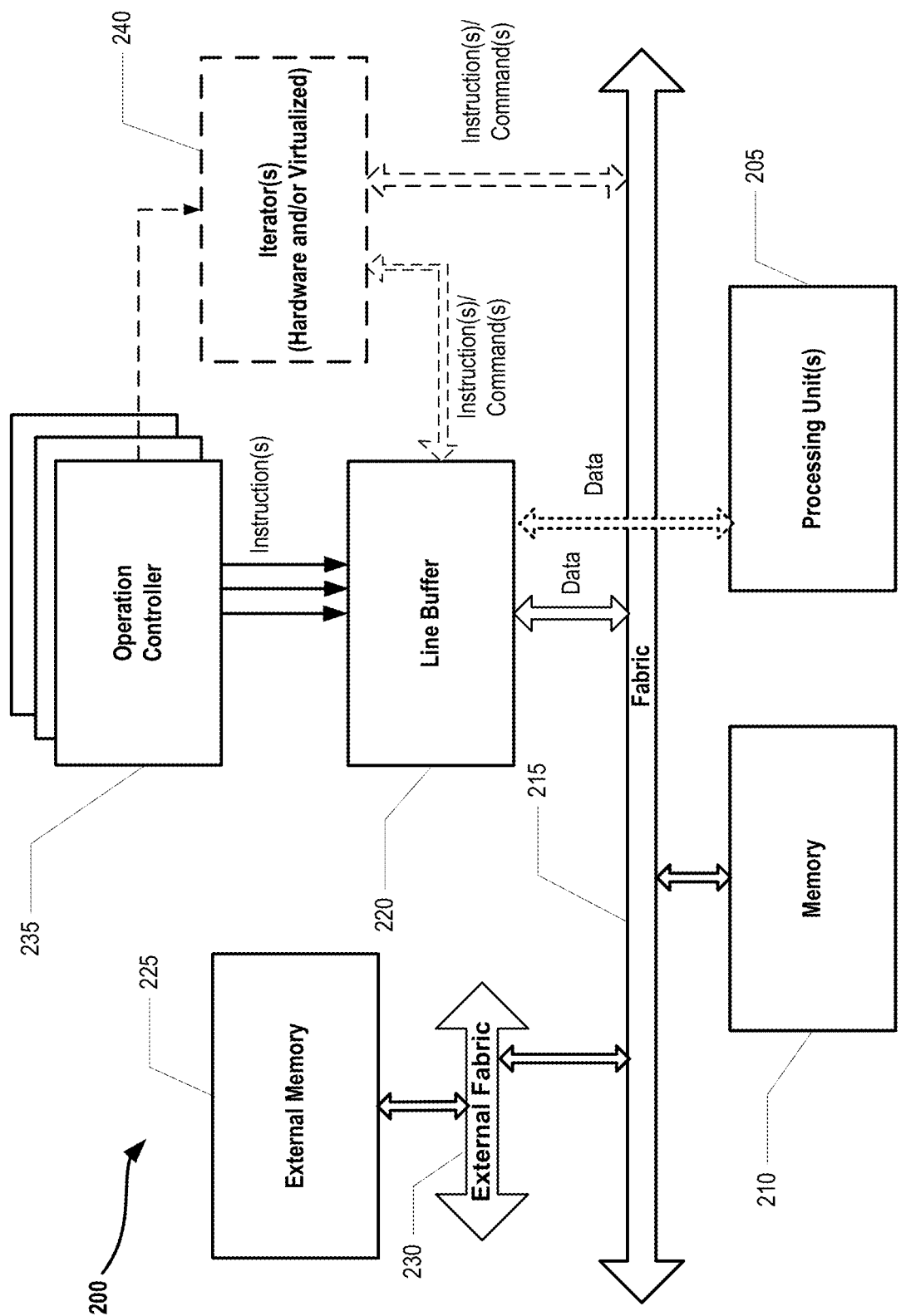
FIG. 2 illustrates a block diagram of an exemplary neural networking environment utilizing a directed line buffer.

FIG. 2 illustrates an exemplary neural network environment 200 operable to employ a directed line buffer 220 as part of data processing. As is shown, the exemplary neural network environment 200 (also referred to herein as a computing device or a computing device environment) comprises one or more operation controllers 235 that cooperate with line buffer 220 to provide one or more instructions for data processing. Line buffer 220 can operate to receive data from cooperating external memory component 225 through external fabric 230 and fabric 215 as well as operate to receive data from iterator(s) 240 (e.g., hardware based and/or virtualized iterators). Operatively, line buffer 220 can insert a calculated shifting bit(s) into the data and write the bit shifted data in line buffer 220 according to one or more instructions received from one or more operation controllers 235 (also referred to herein as a "cooperating controller component 235"). Furthermore, line buffer 220 can cooperate with processing unit(s) (e.g., neuron(s)) to provide the written bit shifted data for further processing. A neural network environment fabric 215 can be a data bus capable of passing through various data. A directed line buffer can be considered as a memory component capable of reading and writing data and/or data elements according to one or more received instructions.

Figure 6:
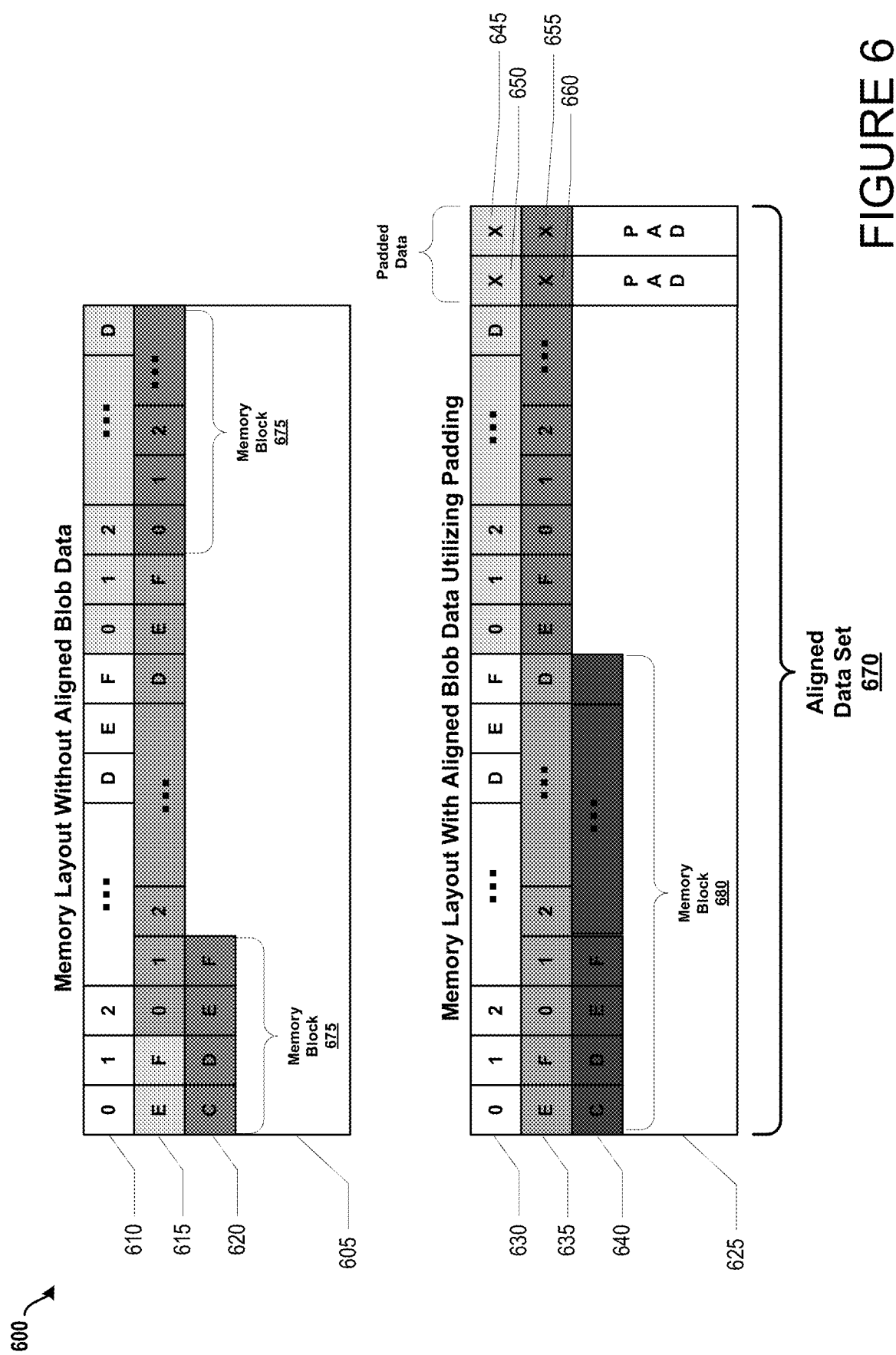
FIG. 6 illustrates a block diagram of exemplary input data represented in an illustrative logical data mapping showing the use of data padding to allow for minimized memory read operations according to the herein described systems and methods.
Figure 7:
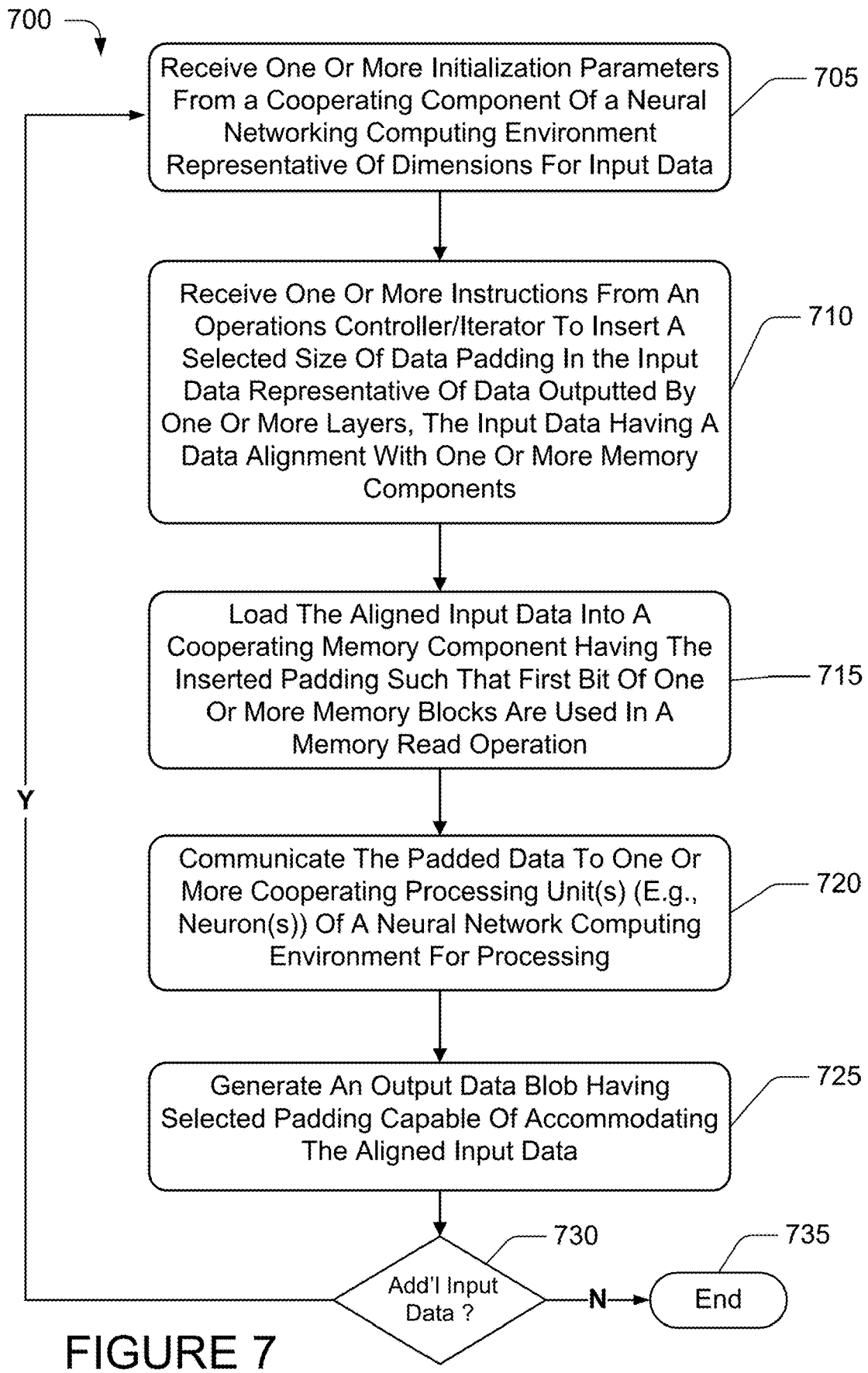
FIG. 7 is a flow diagram of an illustrative process for the processing of data in an exemplary neural network environment using aligned data in accordance with the herein described systems and methods.

In the illustrative operation, the exemplary neural network environment 200 can operatively process data according to the process described in FIG. 7. Specific to the components described in FIG. 2, these components are merely illustrative, as one of ordinary skill in the art would appreciate the processing described in FIGS. 6 and 7 to be performed by other components than those illustrated in FIG. 2.

Also, as is shown in FIG. 2, the exemplary neural network environment can optionally include one or more iterators (e.g., hardware based and/or virtualized iterators) (as indicated by the dashed lines) that can illustratively operate to iterate input data (not shown) for processing by one more neuron processors 205. It is appreciated by one skilled in the art that such optional inclusion of exemplary one or more iterators is merely illustrative, as the inventive concepts described by the herein disclosed systems and methods are operative in an exemplary neural network environment 200 operating without any iterators.

Figure 3:
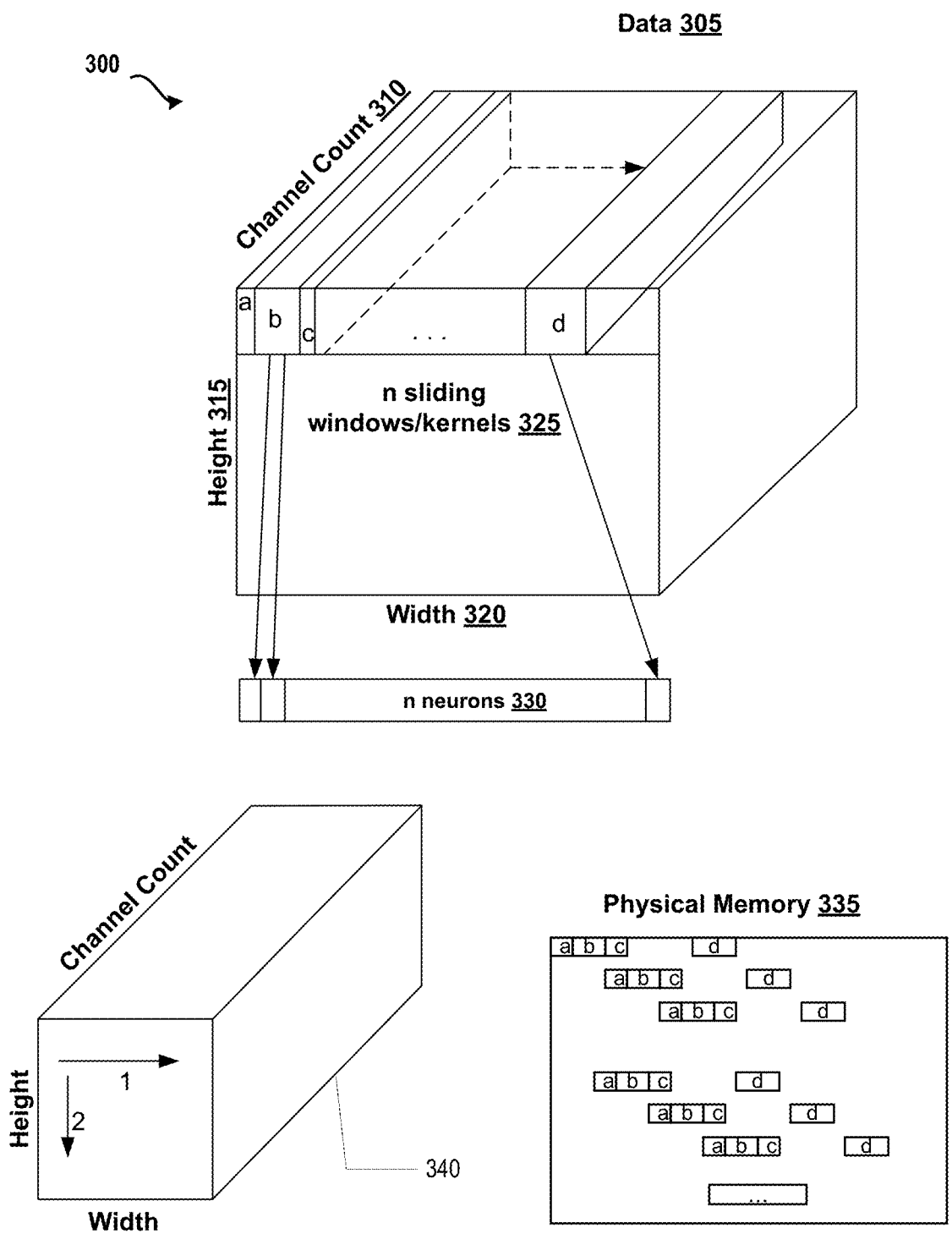
FIG. 3 illustrates a block diagram of exemplary input data represented in an illustrative logical data mapping according to the herein described systems and methods.

FIG. 3 illustrates an example logical data mapping 300 for exemplary input data. As is shown, data 305 can be represented as data having a certain dimension 340 (e.g., such that data dimensions taken as a whole can define a data volume) comprising channel count 310, height 315, and width 320. According to the herein described systems and methods, data 305 can be portioned and prepared for processing by cooperating n neurons 330 such that a first portion a can be communicated to a first neuron, a second portion b can be communicated to a second neuron, and so forth until n portions are communicated to n neurons.

In an illustrative operation, the portions of data 305 can be determined using n sliding windows/kernels 325 based on one or more instructions provided by a cooperating controller component of an exemplary neural network environment (e.g., 200 of FIG. 2). Further as is shown, the input data portions a, b, c, and d can be addressed to a physical memory 335 using one or more initialization parameters provided by a cooperating operation controller component (235) of an exemplary neural network environment (e.g., 200 of FIG. 2).

Figure 4:
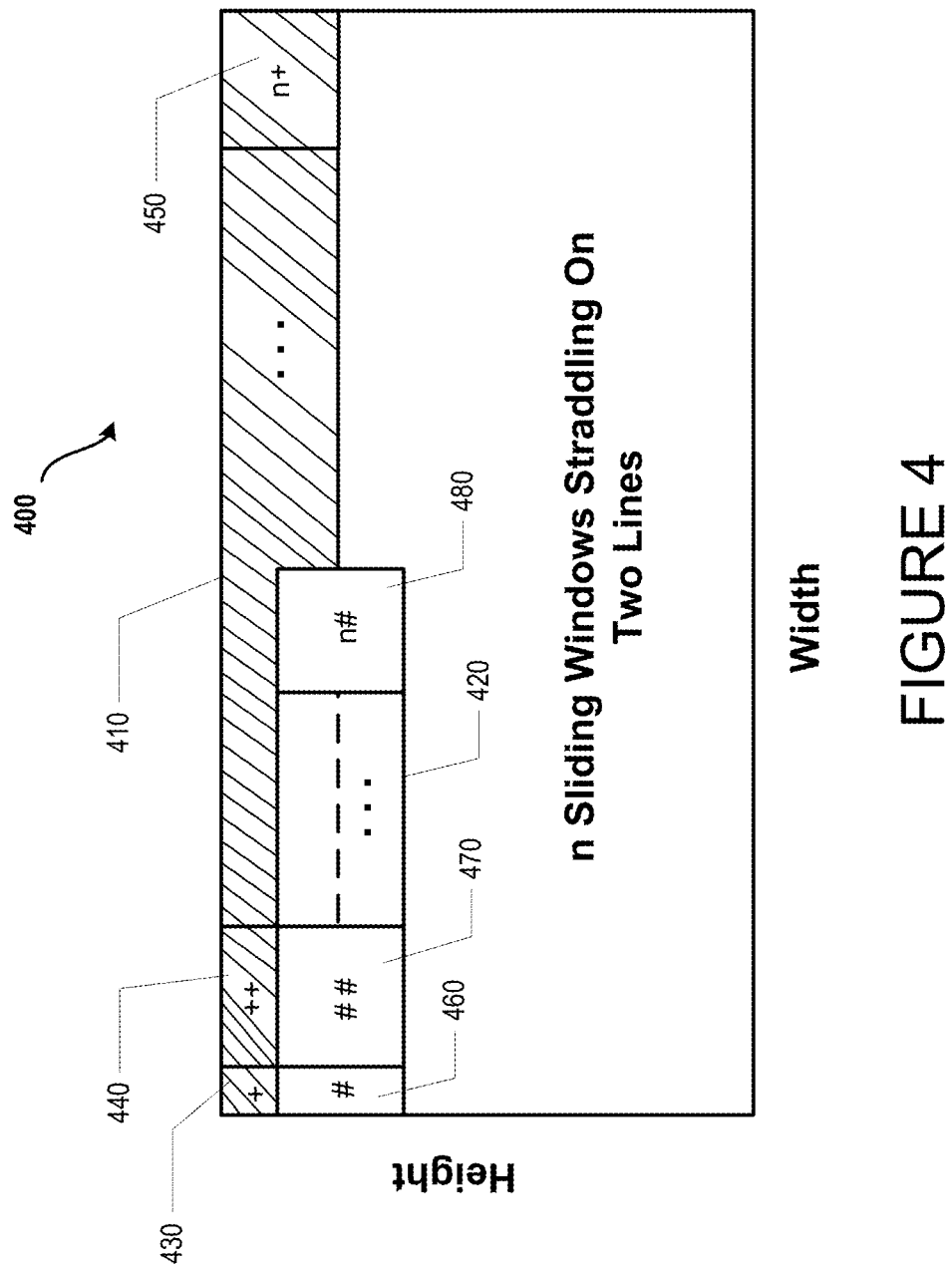
FIG. 4 illustrates a block diagram of exemplary input data represented in an illustrative logical data mapping showing the use of illustrative n sliding windows operative to straddle one or more lines of the logical data mapping.

FIG. 4 illustrates an exemplary logical data map 400 of exemplary input data (not shown). Exemplary logical data map 400 comprises a first line 410 (illustrated with diagonal marks) and a second line 420 (illustrated by dashes). Each map line can include a number of sliding windows (e.g., 430, 440, and 450 for the first line 410 and 460, 470, and 480 for the second line 420). Additionally, as is shown, the logical data map 400 shows the ability of the sliding windows to straddle a data dimensional boundary of the input data (e.g., straddling the first line 410 and the second line 420). Such ability allows for increased performance, as more data can be prepared more efficiently for subsequent processing by the cooperating neural network processing components (e.g., 205 of FIG. 2).

Figure 5:
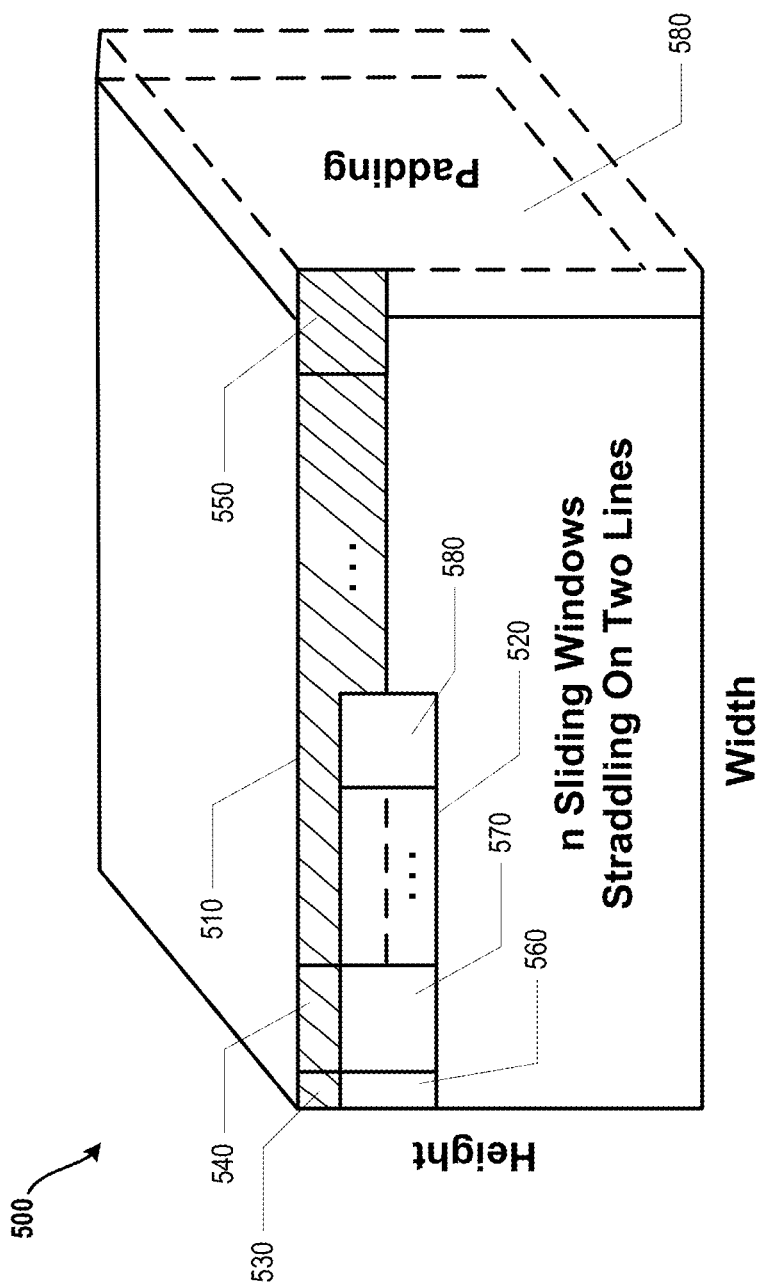
FIG. 5 illustrates a block diagram of exemplary input data represented in an illustrative logical data mapping showing the use of illustrative n sliding windows operative to straddle one or more lines of the logical data mapping operative to allow for data padding as a processing enhancement in accordance with the herein described systems and methods.

FIG. 5 is similar to FIG. 4 and is presented to describe the ability of the herein described systems and methods to allow for the use of padding to further enhance the performance characteristics of an exemplary neural network environment (e.g., 100 of FIGS. 1 and 200 of FIG. 2). As is shown, logical data map 500 (of exemplary input data not shown) can include various sliding windows (530, 540, 550, 560, 570, and 580) that straddle one or more lines (e.g., 510 and 520). Additionally, the logical data map 500 can also include padding 580.

In an illustrative operation, at runtime of an exemplary neural network environment (100 of FIG. 1 or 200 of FIG. 2), padding 580 can be added dynamically. The operation controller 235 of FIG. 2 can specify the amount of padding to be used on each of the dimensions 340 shown in FIG. 3 (e.g., such that the dimensions taken collectively can be considered a data volume) of the input data (e.g., blob), and the neural network environment (e.g., iterator controller instructions) can operatively construct data volumes as if the padding was physically present in memory. Default values can also be generated by the exemplary neural network environment (e.g., iterator controller instructions) in the iterator output positions where the padding was added.

FIG. 6 is a block diagram of exemplary memory data 600. As is shown in FIG. 6, memory data 600 can include a block representation of an exemplary memory layout 605 having unaligned blob data and an exemplary memory layout 625 having aligned blob data utilizing data padding. As is shown, memory layout 605 can comprise various memory blocks 675 that can reside on various memory lines 610, 615, and 620. The exemplary memory blocks 675 can have a selected size. In an illustrative implementation, each set of the memory blocks, as is shown in exemplary memory layout 605, is represented in a different shade of grey.

Similarly, memory layout 625 can comprise various memory blocks 680 that can reside on various memory lines 630, 635, 640. The exemplary memory blocks 680 can have a selected size. In an illustrative implementation, each set of the memory blocks, as is shown in exemplary memory layout 625, is represented in a different shade of grey.

Further, as is shown in FIG. 6, exemplary memory layout 625 can also include padded data blocks having padding values 645, 650, 655, and 660. In an illustrative operation, the additional padded data s data 645, 650, 655, and 660 can be used to align the data elements found in the memory layout 625 such that a read of the set of memory blocks can include all of the data elements for a given set of memory blocks. By way of example, as is shown in FIG. 6, looking to the second line 615 of memory layout 605, it is appreciated that three distinct memory reads are required to read the data elements of this line.

Specifically, a first read of the data elements of the first set of memory blocks that are shaded in light grey, a second read for the second set of memory blocks that are shaded in a darker grey, and a third read for the set of memory blocks indicated by yet a darker shade of grey. Looking to memory layout 625, in using padded data elements 645, 650, 655, and 660, it now takes two memory reads to read the data elements of the second line data of memory layout 625. It is appreciated that the usable data elements of layout 605 and 625 are identical and that usable data elements are one or more data elements that are capable of being processed by the exemplary neural network environment FIG. 7 is a flow diagram of an illustrative process 700 utilizing padded aligned input data to minimize the memory reads in a NN/DNN environment. As is shown, processing begins at block 705 where one or more initialization parameters are received from a cooperating component of the neural network computing environment (e.g., operation controller) wherein the one or more initialization parameters can include data representative of the dimensions for input data Processing then proceeds to block 710 where one or more instructions are received from an operations controller and/or iterator that can operatively insert a selected size of data padding in the input data. Illustratively, the input data can represent data outputted by one or more processing layers and can include a data alignment with one or more memory components. It is appreciated that this illustrative processing is described in context wherein the input data is the output of a processing layer that such description is merely exemplary as the inventive concepts described herein consider the insertion of padding into input data that is not representative of output data of a processing layer such that the input data does not have a data alignment.

Processing then proceeds to block 715 where the aligned data is loaded into a cooperating memory component such that the first bit of one or more memory blocks are used in a memory read operation. The padded data is then communicated to one or more cooperating processing units for processing at block 720. Additionally, an output blob (e.g., logical data mapping) can be generated at block 725 that can also contain the selected padding generated for the output data so as to accommodate the aligned input data dimensions for a subsequent processing layer.

A check is then performed at block 735 to determine if there is additional input data to be processed (i.e., as part of an iteration operation). If there is no additional input data, processing terminates at block 740. However, if additional input data requires an additional iteration operation, processing then reverts to block 705 and proceeds from there.

Figure 8:
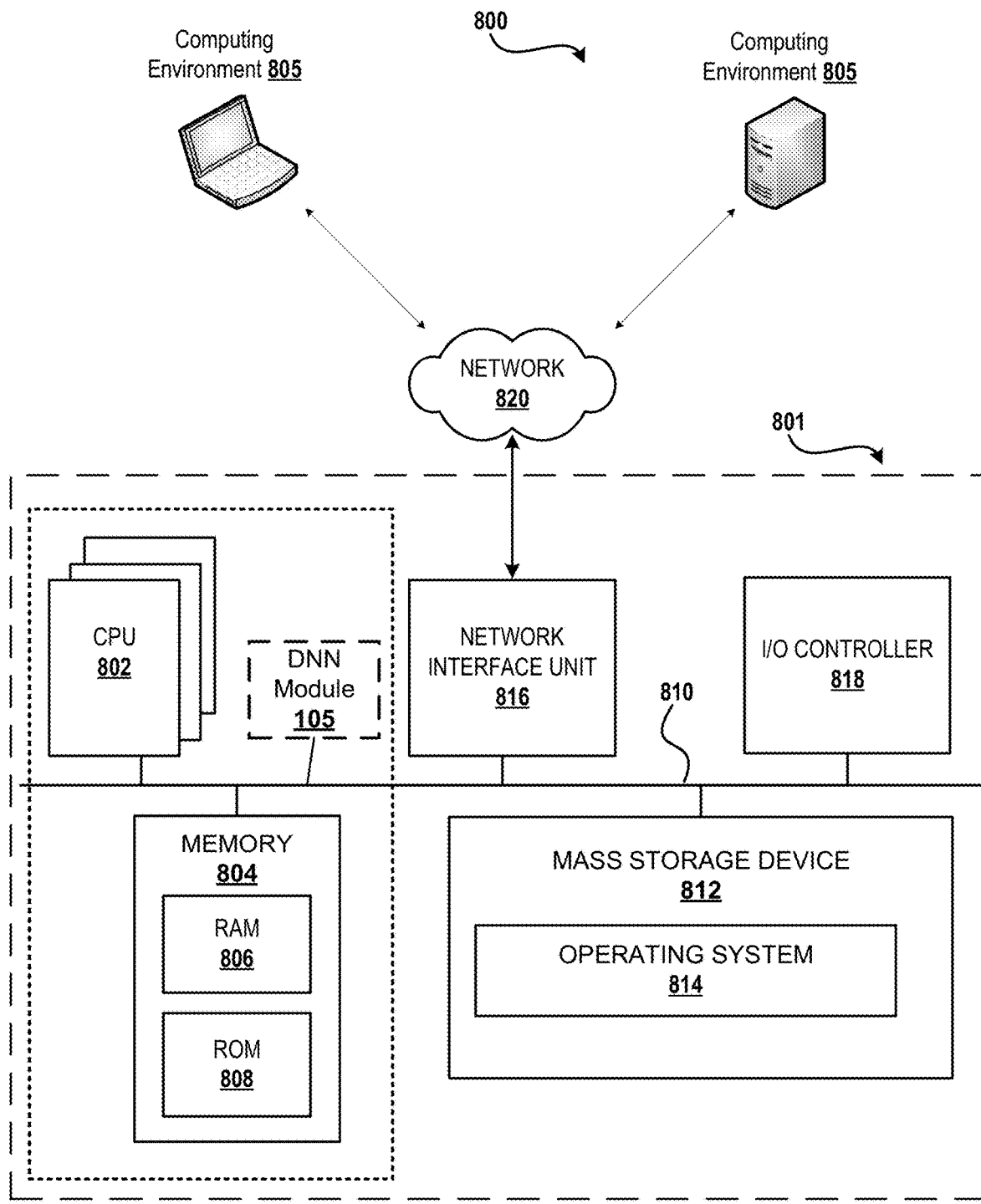
FIG. 8 shows additional details of an illustrative computer architecture for a computer capable of executing the herein described methods.

The computer architecture 800 illustrated in FIG. 8 includes a central processing unit 802 ("CPU"), a system memory 804, including a random-access memory 806 ("RAM") and a read-only memory ("ROM") 808, and a system bus 810 that couples the memory 804 to the CPU 802. A basic input/output system containing the basic routines that help to transfer information between elements within the computer architecture 800, such as during startup, is stored in the ROM 808. The computer architecture 800 further includes a mass storage device 812 for storing an operating system 814, other data, and one or more application programs.

The mass storage device 812 is connected to the CPU 802 through a mass storage controller (not shown) connected to the bus 810. The mass storage device 812 and its associated computer-readable media provide non-volatile storage for the computer architecture 800. Although the description of computer-readable media contained herein refers to a mass storage device, such as a solid-state drive, a hard disk or CD-ROM drive, it should be appreciated by those skilled in the art that computer-readable media can be any available computer storage media or communication media that can be accessed by the computer architecture 800.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

By way of example, and not limitation, computer storage media may include volatile and non-volatile, removable and non-removable media implemented in any method or technology for storage of information such as computer-readable instructions, data structures, program modules or other data. For example, computer media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer architecture 800. For purposes of the claims, the phrase "computer storage medium," "computer-readable storage medium" and variations thereof, does not include waves, signals, and/or other transitory and/or intangible communication media, per se.

According to various techniques, the computer architecture 800 may operate in a networked environment using logical connections to remote computers 805 through a network 820 and/or another network (not shown). The computer architecture 800 may connect to the network 820 through a network interface unit 816 connected to the bus 810. It should be appreciated that the network interface unit 816 also may be utilized to connect to other types of networks and remote computer systems. The computer architecture 800 also may include an input/output controller 818 for receiving and processing input from a number of other devices, including a physical sensor 837, a keyboard, mouse, or electronic stylus (not shown in FIG. 8). Similarly, the input/output controller 818 may provide output to a display screen, a printer, or other type of output device (also not shown in FIG. 8). It should also be appreciated that via a connection to the network 820 through a network interface unit 816, the computing architecture may enable DNN module 105 to communicate with the computing environments 100.

It should be appreciated that the software components described herein may, when loaded into the CPU 802 and/or the DNN Module 105 and executed, transform the CPU 802 and/or the DNN Module 105 and the overall computer architecture 800 from a general-purpose computing system into a special-purpose computing system customized to facilitate the functionality presented herein. The CPU 802 and/or the DNN Module 105 may be constructed from any number of transistors or other discrete circuit elements and/or chipset, which may individually or collectively assume any number of states. More specifically, the CPU 802 and/or the DNN Module 105 may operate as a finite-state machine, in response to executable instructions contained within the software modules disclosed herein. These computer-executable instructions may transform the CPU 802 by specifying how the CPU 802 transitions between states, thereby transforming the transistors or other discrete hardware elements constituting the CPU 802.

Encoding the software modules presented herein also may transform the physical structure of the computer-readable media presented herein. The specific transformation of physical structure may depend on various factors, in different implementations of this description. Examples of such factors may include, but are not limited to, the technology used to implement the computer-readable media, whether the computer-readable media is characterized as primary or secondary storage, and the like. For example, if the computer-readable media is implemented as semiconductor-based memory, the software disclosed herein may be encoded on the computer-readable media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer architecture 800 in order to store and execute the software components presented herein. It also should be appreciated that the computer architecture 800 may include other types of computing devices, including hand-held computers, embedded computer systems, personal digital assistants, and other types of computing devices known to those skilled in the art. It is also contemplated that the computer architecture 800 may not include all of the components shown in FIG. 8, may include other components that are not explicitly shown in FIG. 8, or may utilize an architecture completely different than that shown in FIG. 8.

Computing system 800, described above, can be deployed as part of a computer network. In general, the above description for computing environments applies to both server computers and client computers deployed in a network environment.

Figure 9:
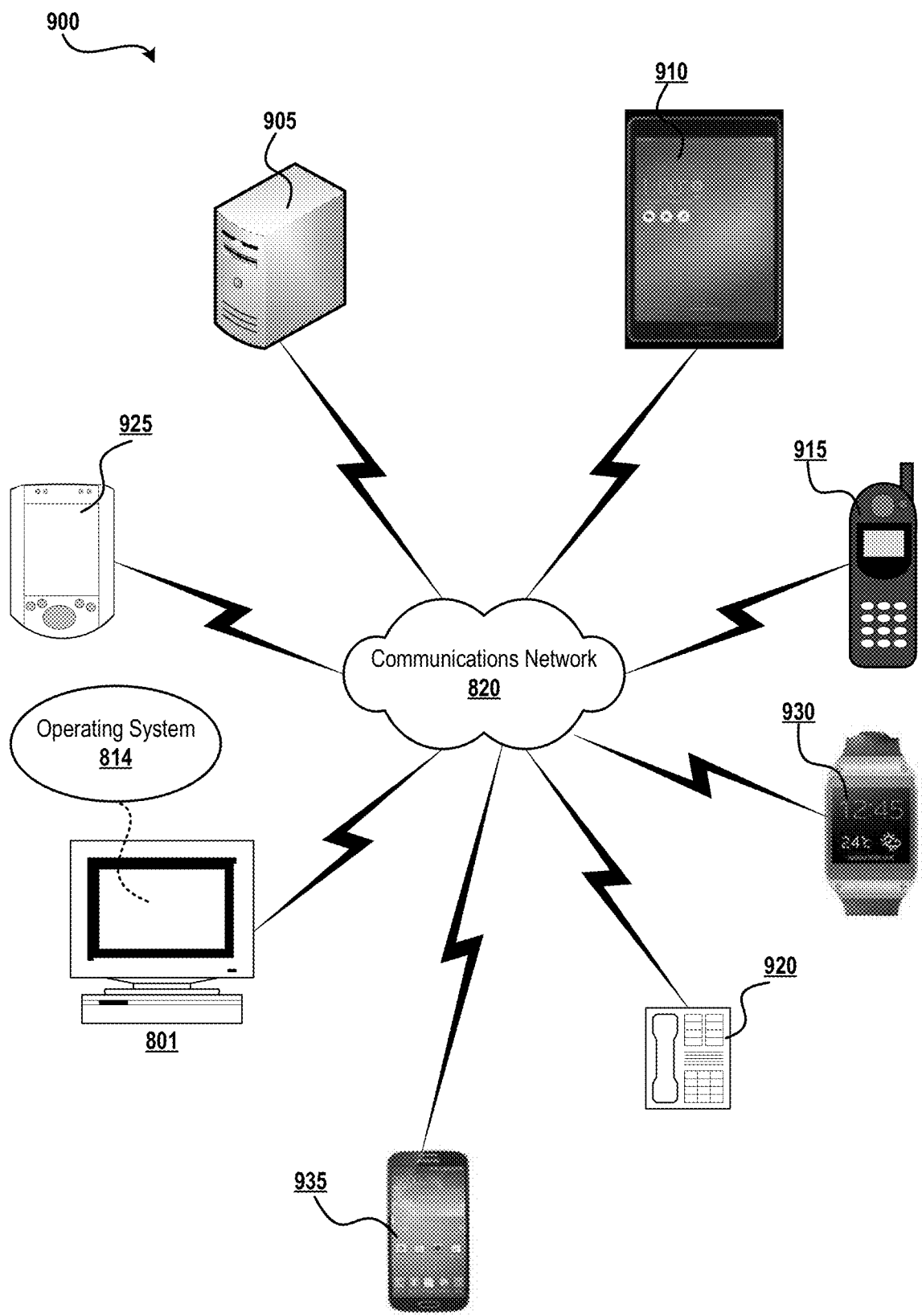
FIG. 9 shows additional details of illustrative computing devices cooperating in accordance with the herein described systems and methods.

FIG. 9 illustrates an exemplary illustrative networked computing environment 900, with a server in communication with client computers via a communications network, in which the herein described apparatus and methods may be employed. As shown in FIG. 9, server(s) 905 may be interconnected via a communications network 820 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing environments such as a tablet personal computer 910, a mobile telephone 915, a telephone 920, a personal computer(s) 801, a personal digital assistant 925, a smart phone watch/personal goal tracker (e.g., Apple Watch, Samsung, FitBit, etc.) 930, and a smart phone 935. In a network environment in which the communications network 820 is the Internet, for example, server(s) 905 can be dedicated computing environment servers operable to process and communicate data to and from client computing environments 801, 910, 915, 920, 925, 930, and 935 via any of a number of known protocols, such as, hypertext transfer protocol (HTTP), file transfer protocol (FTP), simple object access protocol (SOAP), or wireless application protocol (WAP). Additionally, the networked computing environment 900 can utilize various data security protocols such as secured socket layer (SSL) or pretty good privacy (PGP). Each of the client computing environments 801, 910, 915, 920, 925, 930, and 935 can be equipped with operating system 814 operable to support one or more computing applications or terminal sessions such as a web browser (not shown), or other graphical user interface (not shown), or a mobile desktop environment (not shown) to gain access to the server computing environment(s) 905.

Server(s) 905 may be communicatively coupled to other computing environments (not shown) and receive data regarding the participating user's interactions/resource network. In an illustrative operation, a user (not shown) may interact with a computing application running on a client computing environment(s) to obtain desired data and/or computing applications. The data and/or computing applications may be stored on server computing environment(s) 905 and communicated to cooperating users through client computing environments 801, 910, 915, 920, 925, 930, and 935, over an exemplary communications network 820. A participating user (not shown) may request access to specific data and applications housed in whole or in part on server computing environment(s) 905. These data may be communicated between client computing environments 801, 910, 915, 920, 925, 930, 935 and server computing environment(s) 905 for processing and storage. Server computing environment(s) 905 may host computing applications, processes and applets for the generation, authentication, encryption, and communication of data and applications and may cooperate with other server computing environments (not shown), third party service providers (not shown), network attached storage (NAS) and storage area networks (SAN) to realize application/data transactions.

EXAMPLE CLAUSES

The disclosure presented herein may be considered in view of the following clauses.

Example Clause A, a system for enhanced data processing in a neural network environment, the system comprising at least one processor, at least one cooperating memory component in communication with the at least one processor, the at least one cooperating memory component having computer-readable instructions stored thereupon that, when executed by the at least one processor, cause the at least one processor to receive one or more initialization parameters from a cooperating controller component of the neural network environment, the initialization parameters comprising data representative of the dimensions of the data to be processed by the neural network environment and data representative of the size of a selected data padding to insert into the data, the selected data padding size being selected such that the width size of the input data for a processing layer is a multiple of a memory block size of the at least one memory, generate an aligned input data set using the inserted selected data padding, load the aligned data set (670) into the at least one cooperating memory component of the neural network environment, read the aligned data set (670) from the at least one cooperating memory component of the neural network environment, and communicate the aligned data set from the at least one memory component to the one or more processing components of the neural network environment for processing.

Example Clause B, the system of Example Clause A, further comprising receiving one or more instructions from the cooperating controller component to generate an output blob having the selected inserted data padding operative to receive data processed by the one or more processing components of the neural network environment.

Example Clause C, the system of Example Clauses A and B, wherein the computer-readable instructions further cause the at least one processor to communicate data that is traversed by a cooperating iterator to the at least one cooperating memory component.

Example Clause D, the system of Example Clauses A through C, wherein the computer-readable instructions further cause the at least one processor to traverse the data utilizing one or more sliding windows, the windows operative to select one or more data elements of the data volume as the one or more portions communicated to the one or more processing components.

Example Clause E, the system of Example Clauses A through D, wherein the computer-readable instructions further cause the at least one processor to traverse the loaded data using one or more sliding windows that straddle a data dimensional boundary of the loaded data.

Example Clause F, the system of claim Example Clauses A through E, wherein the computer-readable instructions further cause the at least one processor to insert one or more data paddings into the loaded data.

Example Clause G, the system of claim Example Clauses A through F, wherein the computer-readable instructions further cause the cooperating iterator to generate an output blob having the selected inserted data padding.

Example Clause H, a computer-implemented method, comprising receiving one or more initialization parameters from a cooperating controller component of a neural network environment, the initialization parameters comprising data representative of the dimensions of the data to be processed by the neural network environment and data representative of the size of a selected data padding to insert into the data and inserting the selected data padding into the input data, the selected data padding size being the selected data padding size being selected such that the width size of the input data for a processing layer is a multiple of a memory block size of the at least one memory, generating an aligned input data set using the inserted selected data padding, loading the aligned data set into at least one cooperating memory component of the neural network environment, reading a first bit of a memory block from the at least one cooperating memory component of the neural network environment, and communicating the aligned data set from the at least one memory component to the one or more processing components of the neural network environment for processing, and generating an output blob having the selected inserted data padding operative to receive data processed by the one or more processing components of the neural network environment.

Example Clause I, the computer-implemented method of Example Clause H, wherein the input data is stored in the at least one cooperating memory component in one or more memory lines.

Example Clause J, the computer-implemented method of Example Clauses H and I, wherein sliding windows are operative to straddle a data dimensional boundary of the data.

Example Clause K, the computer-implemented method of Example Clause H through J, further comprising selecting the first bit of a memory block of the at least one memory component to read when processing the aligned input data by the one or more processing components of the neural network environment.

Example Clause L, the computer-implemented method of Example Clauses H through K, further comprising processing one or more channels of a kernel of the input data by an iterator to insert the selected data padding to generate the aligned data set.

Example Clause M, the computer-implemented method of Example Clauses H through L, further comprising generating an output blob by an iterator having the selected data padding, the output blob operative to receive processed data by the one or more processing components of the neural network environment.

Example Clause N, the computer-implemented method of Example Clauses H through M, further comprising performing a convolution operation by an iterator on the input data.

Example Clause O, the computer-implemented method of Example Clauses H through N, further comprising calculating the selected data padding size as a data padding width size for insertion into the input data resulting in the least minimal number of reads per memory block line of the memory blocks of the at least one cooperating memory component.

Example Clause P, a computer-readable storage medium having computer-executable instructions stored thereupon which, when executed by one or more processors of a computing device, cause the one or more processors of the computing device to receive one or more initialization parameters from a cooperating controller component of a neural network environment, the initialization parameters comprising data representative of the dimensions of the data to be processed by the neural network environment and data representative of the size of a selected data padding to insert into the input data, the selected data padding size being the selected data padding size being selected such that the width size of the input data for a processing layer is a multiple of a memory block size of the at least one memory generate an aligned input data set using the inserted selected data padding, load the aligned data set into at least one cooperating memory component of the neural network environment, read the aligned data set from the at least one cooperating memory component of the neural network environment, and communicate the aligned data set from the at least one memory component to the one or more processing components of the neural network environment for processing.

Example Clause Q, the computer-readable storage medium of Example Clause P, wherein the instructions further cause the one or more processors of the computing device to generate an output blob having the selected data padding therein.

Example Clause R, the computer-readable storage medium of Example Clauses P and Q, wherein the instructions further cause the one or more processors of the computing device to read the first bit of one or more memory blocks of the at least one cooperating memory component representative of the aligned data set.

Example Clause S, the computer-readable storage medium of Example Clauses P through R, wherein the instructions further cause the one or more processors of the computing device to calculate the selected data padding size as a data padding width size for insertion into the input data resulting in the minimum number of reads per memory block line of the memory blocks of the at least one cooperating memory component.

Example Clause T, the computer-readable storage medium of Example Clauses P through S, wherein the instructions further cause the one or more processors of the computing device to, traverse the loaded data utilizing a logical data mapping of the loaded data, the traversing of the loaded data comprising applying one or more sliding windows to the logical data mapping to associate a portion of the loaded data to one or more physical memory addresses.

Example Clause U, the computer readable medium of Example Clauses P through T, wherein the at least one cooperating memory component cooperates with a physical sensor capable of producing input data comprising audio data, video data, haptic sensory data, and other data for subsequent processing by the one or more cooperating processing units.

Example Clause V, the computer readable medium of Example Clauses P through U, wherein the one or more cooperating processing units electronically cooperate with one or more output physical components operative to receive for human interaction processed input data comprising audio data, video data, haptic sensory data and other data.

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A system for enhanced data processing in a neural network environment, the system comprising:
    at least one processor; and
    at least one cooperating memory component in communication with the at least one processor, the at least cooperating memory component having a selected memory block size and computer-readable instructions stored thereupon that, when executed by the at least one processor, cause the at least one processor to:
        receive one or more initialization parameters from a cooperating controller component of the neural network environment, the initialization parameters comprising dimensions of data to be processed by the neural network environment and a size of a selected data padding to insert into the data, the selected data padding size being selected such that a width size of input data for a processing layer of the neural network environment is a multiple of the selected memory block size of the at least one cooperating memory component;
        generate an aligned input data set using the inserted selected data padding;
        load the aligned data set into the at least one cooperating memory component;
        read the aligned data set from the at least one cooperating memory component; and
        communicate the aligned data set from the at least one memory component to one or more processing components of the neural network environment for processing.

2. The system of claim 1, further comprising receiving one or more instructions from the cooperating controller component to generate an output blob having the selected inserted data padding operative to receive data processed by the one or more processing components of the neural network environment.

3. The system of claim 1, wherein the computer-readable instructions further cause the at least one processor to communicate data that is traversed by a cooperating iterator to the at least one cooperating memory component.

4. The system of claim 3, wherein the computer-readable instructions further cause the at least one processor to traverse the data utilizing one or more sliding windows, the windows operative to select one or more data elements of a data volume as the one or more portions communicated to the one or more processing components.

5. The system of claim 4, wherein the computer-readable instructions further cause the at least one processor to traverse the loaded data using one or more sliding windows that straddle a data dimensional boundary of the loaded data.

6. The system of claim 5, wherein the computer-readable instructions further cause the at least one processor to insert one or more data paddings to the loaded data.

7. The system of claim 6, wherein the computer-readable instructions further cause the cooperating iterator to generate an output blob having the selected inserted data padding.

8. A computer-implemented method, comprising:
    receiving one or more initialization parameters from a cooperating controller component of a neural network environment, the initialization parameters comprising dimensions of data to be processed by the neural network environment and a size of a selected data padding to insert into the data, the selected data padding size being selected such that a width size of input data for a processing layer of the neural network environment is a multiple of a selected memory block size of the at least one cooperating memory component;
    generating an aligned input data set using the inserted selected data padding;
    the aligned data set into the at least one cooperating memory component;
    reading the aligned data set from the at least one cooperating memory component; and
    communicating the aligned data set from the at least one cooperating memory component to one or more processing components of the neural network environment for processing; and
    generating an output blob having the selected inserted data padding operative to receive data processed by the one or more processing components of the neural network environment.

9. The computer-implemented method of claim 8, wherein the input data is stored in the at least one cooperating memory component in one or more memory lines.

10. The computer-implemented method of claim 8, wherein sliding windows are operative to straddle a data dimensional boundary of the data.

11. The computer-implemented method of claim 10, further comprising:
    selecting the first bit of a memory block of the at least one cooperating memory component to read when processing the aligned input data by the one or more processing components of the neural network environment.

12. The computer-implemented method of claim 8, further comprising:
    processing one or more channels of a kernel of the input data by an iterator to insert the selected data padding to generate the aligned data set.

13. The computer-implemented method of claim 12, further comprising:
    generating an output blob by an iterator having the selected data padding, the output blob operative to receive processed data by the one or more processing components of the neural network environment.

14. The computer-implemented method of claim 8, further comprising:
    performing a convolution operation by an iterator on the input data.

15. The computer-implemented method of claim 8, further comprising:
    calculating the selected data padding size as a data padding width size for insertion into the input data resulting in the minimum number of reads per memory block line of the memory blocks of the at least one cooperating memory component.

16. A computer-readable storage medium having computer-executable instructions stored thereupon which, when executed by one or more processors of a computing device, cause the one or more processors of the computing device to:
    receive one or more initialization parameters from a cooperating controller component of a neural network environment, the initialization parameters comprising dimensions of data to be processed by the neural network environment and a size of a selected data padding to insert into the data, the selected data padding size being selected such that a width size of input data for a processing layer of the neural network environment is a multiple of a selected memory block size of the at least one cooperating memory component;

generate an aligned input data set using the inserted selected data padding;

load the aligned data set into the at least one cooperating memory component;

read the aligned data set from the at least one cooperating memory component; and communicate the aligned data set from the at least one cooperating memory component to one or more processing components of the neural network environment for processing.

17. The computer-readable storage medium of claim 16, wherein the instructions further cause the one or more processors of the computing device to:

generate an output blob having the selected data padding therein.

18. The computer-readable storage medium of claim 17, wherein the instructions further cause the one or more processors of the computing device to:

read the first bit of one or more memory blocks of the at least one cooperating memory component representative of the aligned data set.

19. The computer-readable storage medium of claim 16, wherein the instructions further cause the one or more processors of the computing device to:

calculate the selected data padding size as a data padding width size for insertion into the input data resulting in the least minimal number of reads per memory block line of the memory blocks of the at least one cooperating memory component.

20. The computer-readable storage medium of claim 16, wherein the instructions further cause the one or more processors of the computing device to:

traverse the loaded data utilizing a logical data mapping of the loaded data, the traversing of the loaded data comprising applying one or more sliding windows to the logical data mapping to associate a portion of the loaded data to one or more physical memory addresses.

21. The computer readable medium of claim 16, wherein the at least one cooperating memory component cooperates with a physical sensor capable of producing input data comprising audio data, video data, haptic sensory data, and other data for subsequent processing by the one or more cooperating processing units.

22. The computer readable medium of claim 21, wherein the one or more cooperating processing units electronically cooperate with one or more output physical components operative to receive for human interaction processed input data comprising audio data, video data, haptic sensory data and other data.

\* \* \* \* \*